(12) United States Patent
Hua et al.

(10) Patent No.: US 12,399,230 B2
(45) Date of Patent: Aug. 26, 2025

(54) BBU FAULT DIAGNOSIS METHOD AND APPARATUS, ELECTRONIC DEVICE, AND STORAGE MEDIUM

(71) Applicant: INSPUR SUZHOU INTELLIGENT TECHNOLOGY CO., LTD., Jiangsu (CN)

(72) Inventors: Yaoyu Hua, Jiangsu (CN); Weikai Kong, Jiangsu (CN); Ruijie Wang, Jiangsu (CN); Zhaofeng Zhang, Jiangsu (CN); Yuanshuai Sun, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 417 days.

(21) Appl. No.: 17/908,947

(22) PCT Filed: Sep. 24, 2020

(86) PCT No.: PCT/CN2020/117276
§ 371 (c)(1),
(2) Date: Sep. 2, 2022

(87) PCT Pub. No.: WO2021/159710
PCT Pub. Date: Aug. 19, 2021

(65) Prior Publication Data
US 2023/0375639 A1    Nov. 23, 2023

(30) Foreign Application Priority Data

Feb. 14, 2020    (CN) .......................... 202010093574.3

(51) Int. Cl.
*G01R 31/42*        (2006.01)
*G06F 1/30*         (2006.01)

(52) U.S. Cl.
CPC .............. *G01R 31/42* (2013.01); *G06F 1/30* (2013.01)

(58) Field of Classification Search
CPC ................................. G06F 1/30; G01R 31/42
See application file for complete search history.

(56) References Cited

U.S. PATENT DOCUMENTS 8,375,249 B1    2/2013  LoRusso
9,098,390 B2 *  8/2015  Liu ........................... G06F 1/30
(Continued)

FOREIGN PATENT DOCUMENTS

CN    107153591 A    9/2017
CN    107247647 A    10/2017
(Continued)

OTHER PUBLICATIONS

CN-108802627-A, translation is furnished in the same copy. (Year: 2018).*

(Continued)

*Primary Examiner* — Elias Desta
(74) *Attorney, Agent, or Firm* — Cooper Legal Group, LLC

(57) ABSTRACT

A BBU fault diagnosis method includes, whether a power supply is normal during switching from a main power supply to a target BBU is determined based on power supply switching data. If NO, a fault may be accurately located in a switching logic. If YES, a working state of the target BBU is subsequently determined according to a hardware signal of the target BBU, and whether there is an anomaly occurring to the target BBU during operation is determined based on the working state. If YES, a specific anomaly source causing the anomaly is further determined by fault simulation, such that a targeted repair is performed to make the target BBU return to normal.

17 Claims, 2 Drawing Sheets

(56) References Cited

U.S. PATENT DOCUMENTS

| | | |
|---|---|---|
| 9,231,440 B2 * | 1/2016 | Son .................. H02J 9/062 |
| 2007/0025074 A1 | 2/2007 | Sone |
| 2015/0177808 A1 | 6/2015 | Sarti |

FOREIGN PATENT DOCUMENTS

| | | | |
|---|---|---|---|
| CN | 107436414 A | | 12/2017 |
| CN | 108802627 A | * | 11/2018 |
| CN | 109542706 A | | 3/2019 |
| CN | 109634398 A | * | 4/2019 |
| CN | 110007173 A | | 7/2019 |
| CN | 111312325 A | | 6/2020 |
| WO | 20160137510 A1 | | 9/2016 |

OTHER PUBLICATIONS

CN-109634398-A, translation is furnished in the same copy. (Year: 2019).*

International Search Report cited in PCT application PCT/CN2020/117276, mailed Dec. 23, 2020, 7 pages.

Written Opinion of International Searching Authority of corresponding PCT application PCT/CN2020/117276, mailed Dec. 23, 2020, 10 pages.

First Office Action of corresponding CN priority application CN202010093574.3, mailed Jan. 5, 2021, 8 pages.

Second Office Action of corresponding CN priority application CN202010093574.3, mailed Jun. 18, 2021, 14 pages.

* cited by examiner

BBU FAULT DIAGNOSIS METHOD AND APPARATUS, ELECTRONIC DEVICE, AND STORAGE MEDIUM

This application claims priority to Chinese Patent Application No. 202010093574.3, filed on Feb. 14, 2020, in China National Intellectual Property Administration and entitled "BBU Fault Diagnosis Method and Apparatus, Electronic Device, and Storage Medium", the contents of which are hereby incorporated by reference in its entirety.

FIELD

The present application relates to the technical field of operation assurance of storage systems, and particularly to a Backup Battery Unit (BBU) fault diagnosis method and apparatus, an electronic device, and a readable storage medium.

BACKGROUND

In the era of big data, higher requirements are made on the reliability of storage devices, particularly on the efficiency and accuracy of analyzing and locating problems related to BBUs and primary power supplies.

Once a storage system has problems related to BBU/Power Supply Unit (PSU) (industrial power supply), analysis, testing, and verification processes are needed. Conventional technologies often require staff to visit the customer's equipment site for manual debugging and analysis, and the staff needs to check the retrieved BBU logs one by one, which is not only inefficient but also prone to omissions because of human instability. In particular, some low-probability on-site problems unlikely to reproduce are even more difficult to discover and trace. These problems prolong a design and development verification period of a storage product, increase the after-sales service cost, and reduce the stability and reliability of the storage product.

Therefore, how to overcome the foregoing shortcomings of the prior art is a technical problem urgent to be solved by those skilled in the art.

SUMMARY

The present application provides a BBU fault diagnosis method and apparatus, an electronic device, and a readable storage medium, aiming to provide a fully-automatic BBU fault diagnosis method, thereby reducing the fault diagnosis cost and the after-sales service cost and improving the stability and reliability of a storage product in combination with an actual working condition of a BBU and by full use of the characteristics of a machine of no omission and real-time monitoring.

In order to achieve the above objective, the present application provides a BBU fault diagnosis method, including:
  determining, according to power supply switching data, whether a power supply is able to be switched to a target BBU normally;
  in response to the power supply being able to be switched to the target BBU normally, determining a working state of the target BBU according to hardware signals of the target BBU; and
  in response to the working state being determined to be an abnormal state according to the hardware signals, determining an accurate anomaly source by fault simulation according to various causes for the abnormal state.

In an embodiment, the step of determining, according to power supply switching data, whether the power supply is able to be switched to the target BBU normally includes:
  acquiring an output voltage value of a PSU at each time point;
  acquiring occurrence time of an AC_FAIL signal and a discharge enable signal; calculating a first time interval between the AC_FAIL signal and the discharge enable signal;
  calculating a second time interval between the occurrence time of the AC_FAIL signal and reduction of the output voltage value of the PSU to a preset voltage value; and
  determining, according to the first time interval and the second time interval, whether the power supply is allowed to be switched to the target BBU normally.

In a further embodiment, the step of determining the working state of the target BBU according to the hardware signals of the target BBU includes:
  acquiring a system in-position signal, charge/discharge enable signal, internal discharge enable signal, and AC_FAIL signal of the target BBU;
  determining quality and high/low level variations of the hardware interface signals of the target BBU according to the system in-position signal, the charge/discharge enable signal, the internal discharge enable signal, and the AC_FAIL signal;
  acquiring an SCL/SDA signal on an Inter-Integrated Circuit (I2C) link of the target BBU; and
  determining the working state of the target BBU according to the quality, the high/low level variations, and the SCL/SDA signal.

In a further embodiment, in response to the working state being determined to be a normal state according to the hardware signal, the method further includes:
  acquiring communication data of a storage system and the target BBU; and
  verifying, according to the communication data, whether a program runtime error occurs to the target BBU.

In a further embodiment, after determining the accurate anomaly source by fault simulation according to various causes for the abnormal state, the method further includes:
  determining whether the anomaly source is capable of being repaired automatically; and
  in response to the anomaly source being incapable of being repaired automatically, sending a manual repair prompt through a preset path.

In order to achieve the above objective, the present application further provides a BBU fault diagnosis apparatus, including:
  a power supply normal switching determination unit, configured to determine, according to power supply switching data, whether a power supply is able to be switched to a target BBU normally;
  a hardware interface signal analysis determination unit, configured to, when the power supply is able to be switched to the target BBU normally, determine a working state of the target BBU according to a hardware signals of the target BBU; and
  an anomaly source locating unit, configured to, when the working state is determined to be an abnormal state according to the hardware signal, determine an accurate anomaly source by fault simulation according to various causes for the abnormal state.

In an embodiment, the power supply normal switching determination unit includes:
- a PSU output voltage value acquisition subunit, configured to acquire an output voltage value of a PSU at each time point;
- a signal occurrence time acquisition subunit, configured to acquire occurrence time of an AC_FAIL signal and a discharge enable signal;
- a first time interval calculation subunit, configured to calculate a first time interval between the AC_FAIL signal and the discharge enable signal;
- a second time interval calculation subunit, configured to calculate a second time interval between occurrence of the AC_FAIL signal and reduction of the output voltage value of the PSU to a preset voltage value; and
- a power supply normal switching determination subunit, configured to determine, according to the first time interval and the second time interval, whether the power supply is able to be switched to the target BBU normally.

In a further embodiment, the hardware signal analysis determination unit includes:
- a hardware interface signal acquisition subunit, configured to acquire a system in-position signal, charge/discharge enable signal, internal discharge enable signal, and AC_FAIL signal of the target BBU;
- a hardware interface signal analysis subunit, configured to determine quality and high/low level variations of the hardware interface signals of the target BBU according to the system in-position signal, the charge/discharge enable signal, the internal discharge enable signal, and the AC_FAIL signal;
- an I2C link signal acquisition subunit, configured to acquire an SCL/SDA signal on an I2C link of the target BBU; and
- a working state determination subunit, configured to determine the working state of the target BBU according to the quality, the high/low level variations, and the SCL/SDA signal.

In a further embodiment, when the working state is determined to be a normal state according to the hardware signal, the BBU fault diagnosis apparatus further includes:
- a communication data acquisition unit, configured to acquire communication data of a storage system and the target BBU; and
- a program runtime error existence verification unit, configured to verify, according to the communication data, whether a program runtime error occurs to the target BBU.

In a further embodiment, after the accurate anomaly source is determined by fault simulation according to the various causes for the abnormal state, the BBU fault diagnosis apparatus further includes:
- an automatic repair judgment unit, configured to determine whether the anomaly source is capable of being repaired automatically; and
- a manual repair prompt sending unit, configured to, when the anomaly source is incapable of being repaired automatically, send a manual repair prompt through a preset path.

In order to achieve the above objective, the present application also provides an electronic device, including:
- a memory, configured to store a computer program; and
- a processor, configured to execute the computer program to implement any step of the BBU fault diagnosis method as described in the above contents.

In order to achieve the above objective, the present application also provides a readable storage medium, storing a computer program that is executed by a processor to implement any step of the BBU fault diagnosis method as described in the above contents.

The present application provides a BBU fault diagnosis method, including: determining, according to power supply switching data, whether a power supply is able to be switched to a target BBU normally; when the power supply is able to be switched to the target BBU normally, determining a working state of the target BBU according to a hardware interface signal of the target BBU; and when the working state is determined to be an abnormal state according to the hardware interface signal, determining an accurate anomaly source by fault simulation according to various causes for the abnormal state.

According to the BBU fault diagnosis method provided in the present application, whether a power supply is normal during switching from a main power supply to a target BBU is determined first based on power supply switching data. If the power supply is not switched to the target BBU normally, the fault may be accurately located in a switching logic. If the power supply is switched to the target BBU normally, a working state of the target BBU is subsequently determined according to hardware signals of the target BBU, and whether there is an anomaly occurring to the target BBU during operation is determined based on the working state. If YES, a specific anomaly source causing the anomaly is further determined by fault simulation, such that a targeted repair can by performed so that the target BBU may return to normal. According to the present application, by in-depth analysis of an actual operation process of the BBU, all possible causes of a BBU fault are determined layer by layer, so as to gradually improve the fault determination accuracy. The after-sales service cost is also effectively reduced based on a fully-automatic operation process of a machine.

The present application also provides a BBU fault diagnosis apparatus, an electronic device, and a readable storage medium, which all have the above beneficial effects. Elaborations are omitted herein.

DETAILED DESCRIPTION

The present application provides a BBU fault diagnosis method and apparatus, an electronic device, and a readable storage medium, aiming to provide a fully-automatic BBU fault diagnosis method, thereby reducing the fault diagnosis cost and the after-sales service cost and improving the stability and reliability of a storage product in combination with an actual working condition of a BBU and by full use of the characteristics of a machine of no omission and real-time monitoring.

In order to make the objective, technical solutions, and advantages of the embodiments of the present application clearer, the technical solutions in the embodiments of the present application will be described clearly and completely below in combination with the drawings in the embodiments of the present application. Clearly, the described embodiments are not all but part of embodiments of the present application. All other embodiments obtained by those ordinarily skilled in the art based on the embodiments in the present application without creative work shall fall within the scope of protection of the present application.

Figure 1:
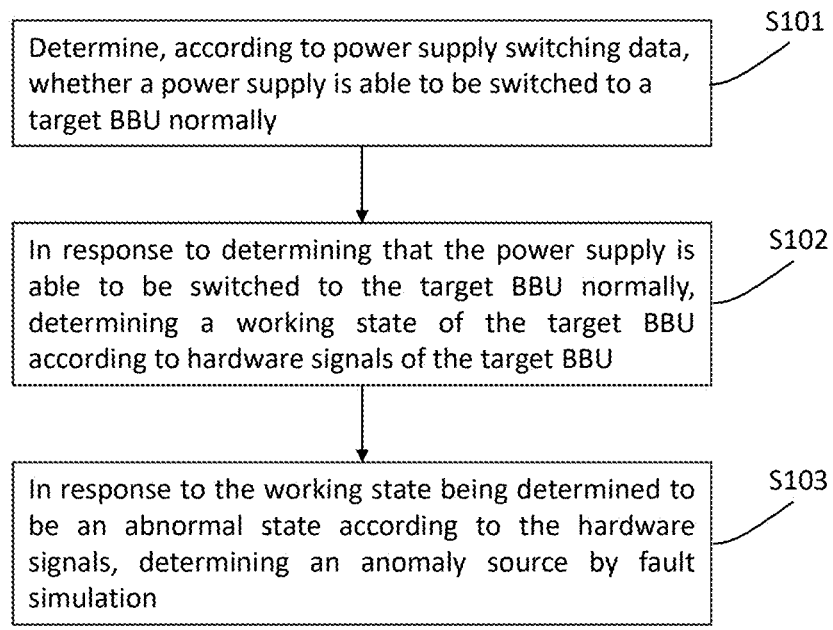
FIG. 1 is a flowchart of a BBU fault diagnosis method according to an embodiment of the present application.

Referring to FIG. 1, FIG. 1 is a flowchart of a BBU fault diagnosis method according to an embodiment of the present application. The method includes the following steps.

In S101, whether a power supply is able to be switched to a target BBU normally is determined according to power supply switching data.

The power supply switching data is a generic term for data capable of describing a process of switching the power supply from a main power supply to the target BBU. The data mainly describes whether timing of power supply switching is as expected. In summary, the power supply switching data describes the performance of each step of the process of switching the power supply to the target BBU in terms of time interval, and a judgment result is further obtained by comparison with an expected normal time interval.

Figure 2:
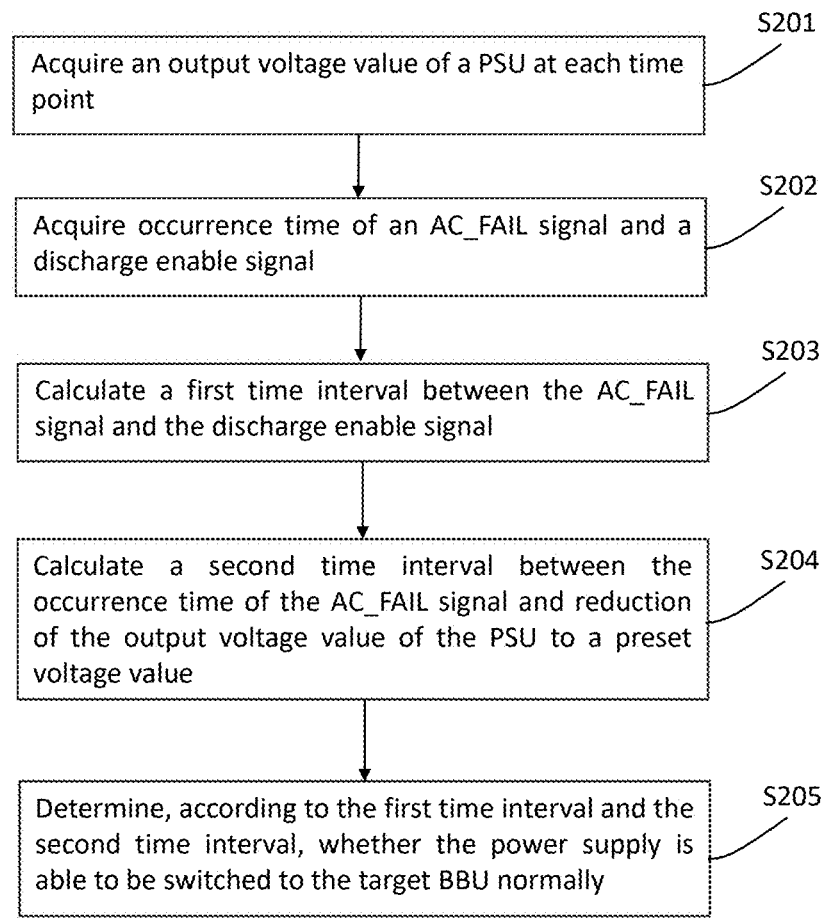
FIG. 2 is a flowchart of a method for determining whether normal switching to a target BBU is able in the BBU fault diagnosis according to an embodiment of the present application.

There is an inclusive, rather than restrictive implementation referring to the flowchart shown in FIG. 2. FIG. 2 is a flowchart of a method for determining whether normal switching to a target BBU is able in a BBU fault diagnosis according to an embodiment of the present application, including the following steps.

In S201, an output voltage value of a PSU at each time point is acquired.

The PSU is an English abbreviation of an industrial power supply in a storage system, and is used to refer to a main power supply (i.e., a power supply powering with a conventional alternating current).

In S202, an occurrence time of an AC_FAIL signal and a discharge enable signal are acquired.

The AC_FAIL signal is an alternating current fault signal. This signal occurs to represent that the main power supply is no longer able to continue powering the storage system normally, and is usually used as a trigger signal of switching the power supply to the BBU. The discharge enable signal is from the target BBU as a result of the target BBU starting to power the storage system in response to the trigger signal.

In S203, a first time interval between the AC_FAIL signal and the discharge enable signal is calculated.

This step aims to calculate a time interval between the AC_FAIL signal and the discharge enable signal according to the occurrence time of the AC_FAIL signal and the discharge enable signal. Therefore, the time interval describes time from the reception of the trigger signal by the target BBU to the start of discharge in response to the trigger signal. A length of the time directly reflects an operation condition of the target BBU.

In S204, a second time interval between occurrence of the AC_FAIL signal and reduction of the output voltage value of the PSU to a preset voltage value is calculated.

When the output voltage of the PSU is reduced to the preset voltage value, it indicates that the main power supply is actually no longer able to power the storage system normally. If the output voltage value of the PSU during normal powering of the storage system is 12 V, the preset voltage value may be 11.4 V.

It can be seen that the time interval between the occurrence of the AC_FAIL signal and the reduction of the output voltage value of the PSU to the preset voltage value describes the sensitivity and effectiveness of the main power supply during switching.

In S205, whether the power supply is able to be switched to the target BBU normally is determined according to the first time interval and the second time interval.

It is to be understood that an abnormal power failure of the storage system is absolutely not allowed, thus the main power supply needs to be switched timely. Therefore, a power supply switching process is comprehensively reflected by the two time intervals in the solution provided in the embodiment shown in FIG. 2.

In S102, when the power supply is able to be switched to the target BBU normally, a working state of the target BBU is determined according to hardware signals of the target BBU.

Based on S101, this step determines, in case of determining according to the power supply switching data that the power supply is able to be switched to the target BBU normally, a working state of the target BBU during operation after starting discharge according to hardware signals of the target BBU.

Figure 3:
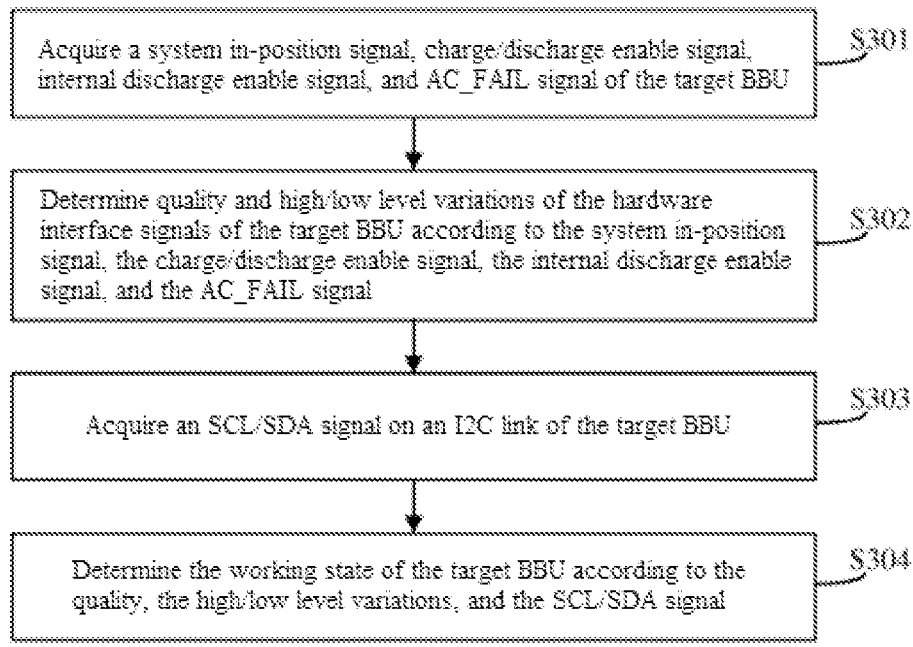
FIG. 3 is a flowchart of a method for determining a working state of a target BBU according to hardware signals in the BBU fault diagnosis method according to an embodiment of the present application.

There is included, but not limited to, an implementation solution referring to the flowchart shown in FIG. 3. FIG. 3 is a flowchart of a method for determining a working state of a target BBU according to hardware signals in a BBU fault diagnosis method according to an embodiment of the present application, including the following steps.

In S301, a system in-position signal, charge/discharge enable signal, internal discharge enable signal, and AC_FAIL signal of the target BBU are acquired.

The system in-position signal is used to represent the most basic working condition of the target BBU, usually including only two conditions: in-position and not-in-position. The charge/discharge enable signal is used to represent that the target BBU is currently able to perform a charge/discharge operation normally. The internal discharge enable signal is used to represent whether an electric signal is transmitted normally in the target BBU. The signals acquired in this step may be collectively referred to as hardware interface signals of the BBU.

In S302, quality and high/low level variations of the hardware interface signals of the target BBU are determined according to the system in-position signal, the charge/discharge enable signal, the internal discharge enable signal, and the AC_FAIL signal.

Based on S301, this step aims to analyze the above-mentioned hardware interface signals to determine corresponding signal quality and high/low level variations of electric signals.

In S303, an SCL/SDA signal on an I2C link of the target BBU is acquired.

SCL/SDA is a signal line of the I2C bus, SDA is a bidirectional signal line, and SCL is a clock line SCL. When data is transmitted on the I2C bus, the most significant bit is sent first. A host sends out a start signal, and an SDA signal jumps from a high level to a low level when an SCL signal is at a high level. Then, the host sends 1-byte data. When data transmission is completed, the host sends out a stop signal, and an SDA signal jumps from a low level to a high level when an SCL signal is at a high level.

In other words, this step aims to further analyze the working state of the BBU according to the properties of the SCL/SDA signal.

In S304, the working state of the target BBU is determined according to the quality, the high/low level variations, and the SCL/SDA signal.

Based on S302 and S303, this step aims to determine the working state of the target BBU more accurately in combination with the quality and high/low level variations of the hardware interface signals, and the SCL/SDA signal.

In S103, when the working state is determined to be an abnormal state according to the hardware signals, an accurate anomaly source is determined by fault simulation according to various causes for the abnormal state.

Based on S102, this step aims to determine an accurate anomaly source by fault simulation according to various causes for the abnormal state in case that the working state is determined to be an abnormal state according to the hardware signals.

In addition to a normal state, the BBU may have the following abnormal states: abnormal charge, abnormal discharge, abnormal internal discharge, abnormal power supply switching test, abnormal system operation logic, abnormal software, etc. There may usually be multiple specific causes for each anomaly. For example, abnormal charge may further include four specific causes: abnormal charge input voltage of the BBU, abnormal charge control logic, abnormal charge software setting, and abnormal charge circuit of the BBU.

Fault simulation refers to simulating, through a program, when a cause for a current abnormal state cannot be determined accurately, signal features from which a certain type of specific causes may be recognized, and further check the causes one by one to determine the specific cause for the abnormal state.

According to the BBU fault diagnosis method provided in the present application, whether a power supply is normal during switching from a main power supply to a target BBU is determined first based on power supply switching data. If the power supply is not switched to the target BBU normally, the fault may be accurately located in a switching logic. If the power supply is switched to the target BBU normally, a working state of the target BBU is subsequently determined according to hardware signals of the target BBU, and whether there is an anomaly occurring to the target BBU during operation is determined based on the working state. If YES, a specific anomaly source causing the anomaly is further determined by fault simulation, such that a targeted repair can be performed so that the target BBU may return to normal. According to the present application, by in-depth analysis of an actual operation process of the BBU, all possible causes for the BBU fault are determined layer by layer, so as to gradually improve the fault determination accuracy. The after-sales service cost is also effectively reduced based on a fully-automatic operation process of a machine.

Based on the contents of the above-mentioned embodiment, in order to further determine an abnormal state that may not be determined according to the hardware signals, the present application also provides the following solution for the case where the working state is determined to be a normal state according to the hardware signal:

acquiring communication data of a storage system and the target BBU; and verifying whether a program runtime error occurs to the target BBU according to the communication data.

That is, it is to determine, by data interaction between the target BBU and the storage system at a software program level, whether there are some anomalies that can only be determined through software data when the hardware signals are normal.

Furthermore, after the accurate anomaly source is determined by fault simulation according to the various causes for the abnormal state, an automatic repair mechanism for faults may further be added. The automatic repair mechanism may operate according to the following method:

determining whether the anomaly source is capable of being repaired automatically; and when the anomaly source is incapable of being repaired automatically, sending a manual repair prompt through a preset path.

Certainly, if the anomaly source is capable of being repaired automatically, the target BBU may directly be repaired to the normal working state.

The complex situation makes it impossible to make descriptions one by one. Those skilled in the art should realize that there may be many examples according to the basic method and principle provided in the present application in combination with actual situations, and all of them shall fall within the scope of protection of the present application without adequate creative work.

Figure 4:
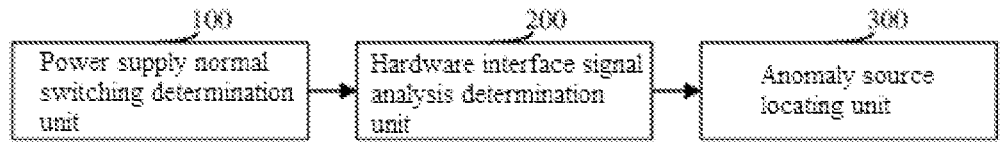
FIG. 4 is a structural block diagram of a BBU fault diagnosis apparatus according to an embodiment of the present application.

Referring to FIG. 4, FIG. 4 is a structural block diagram of a BBU fault diagnosis apparatus according to an embodiment of the present application. The apparatus may include:

a power supply normal switching determination unit 100, configured to determine, according to power supply switching data, whether a power supply is able to be switched to a target BBU normally;

a hardware interface signal analysis determination unit 200, configured to, when the power supply is able to be switched to the target BBU normally, determine a working state of the target BBU according to hardware signals of the target BBU; and an anomaly source locating unit 300, configured to, when the working state is determined to be an abnormal state according to the hardware signals, determine an accurate anomaly source by fault simulation according to various causes for the abnormal state.

The power supply normal switching determination unit 100 may include:

a PSU output voltage value acquisition subunit, configured to acquire an output voltage value of a PSU at each time point;

a signal occurrence time acquisition subunit, configured to acquire occurrence time of an AC_FAIL signal and a discharge enable signal;

a first time interval calculation subunit, configured to calculate a first time interval between the AC_FAIL signal and the discharge enable signal;

a second time interval calculation subunit, configured to calculate a second time interval between occurrence of the AC_FAIL signal and reduction of the output voltage value of the PSU to a preset voltage value; and a power supply normal switching determination subunit, configured to determine, according to the first time interval and the second time interval, whether the power supply is able to be switched to the target BBU normally.

The hardware signal analysis determination unit 200 may include:

a hardware interface signal acquisition subunit, configured to acquire a system in-position signal, charge/ discharge enable signal, internal discharge enable signal, and AC_FAIL signal of the target BBU;

a hardware interface signal analysis subunit, configured to determine quality and high/low level variations of the hardware interface signals of the target BBU according to the system in-position signal, the charge/discharge enable signal, the internal discharge enable signal, and the AC_FAIL signal;

an I2C link signal acquisition subunit, configured to acquire an SCL/SDA signal on an I2C link of the target BBU; and a working state determination subunit, configured to determine the working state of the target BBU according to the quality, the high/low level variations, and the SCL/SDA signal.

Further, the BBU fault diagnosis apparatus may further include:

a communication data acquisition unit, configured to, when the working state is determined to be a normal state according to the hardware signal, acquire communication data of a storage system and the target BBU; and a program runtime error existence verification unit, configured to verify, according to the communication data, whether a program runtime error occurs to the target BBU.

Further, the BBU fault diagnosis apparatus may further include:

an automatic repair judgment unit, configured to, after the accurate anomaly source is determined by fault simulation according to the various causes for the abnormal state, determine whether the anomaly source is capable of being repaired automatically; and a manual repair prompt sending unit, configured to, when the anomaly source is incapable of being repaired automatically, send a manual repair prompt through a preset path.

As an apparatus embodiment corresponding to the above-mentioned embodiment, the present embodiment has all the beneficial effects of the method embodiment. Elaborations are omitted herein.

Based on the above-mentioned embodiments, the present application also provides an electronic device, which may include a memory and a processor. The memory stores a computer program. The processor, when calling the computer program in the memory, may implement the steps provided in the above-mentioned embodiment. Certainly, the electronic device may further include various desired network interfaces, a power supply, other components and parts, etc.

Figure 5:
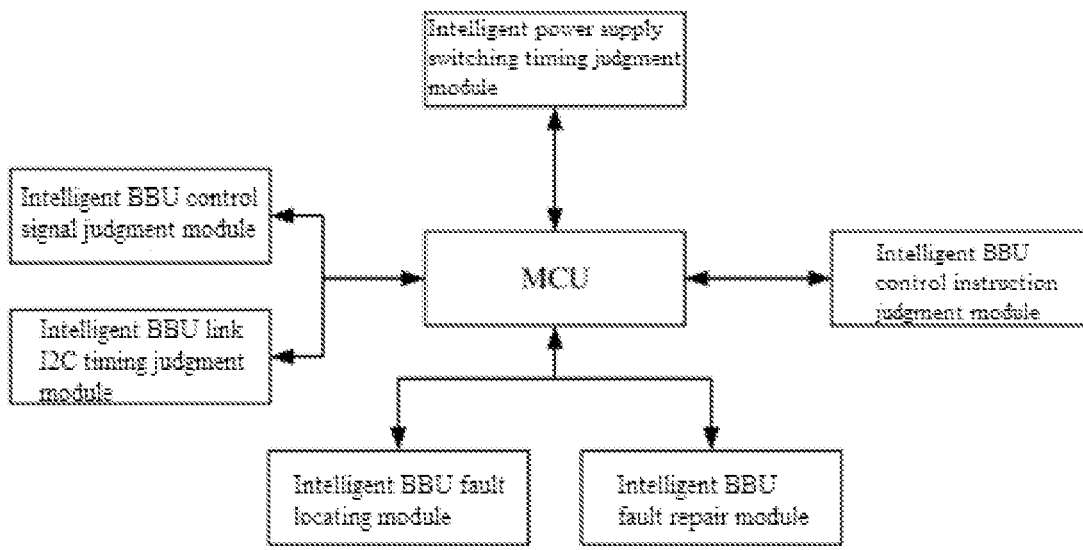
FIG. 5 is a schematic diagram of function modules of an electronic device according to an embodiment of the present application.

A schematic diagram of a modular composition of an exemplary electronic device may refer to FIG. 5. A Microcontroller Unit (MCU) is a data processing and analysis unit. Modules connected with the MCU include: an intelligent BBU control signal judgment module, an intelligent BBU control instruction judgment module, an intelligent BBU link I2C timing judgment module, an intelligent power supply switching timing judgment module, an intelligent BBU fault locating module, and an intelligent BBU fault repair module.

The intelligent BBU control signal judgment module may include two parts: a hardware interface signal monitoring processing circuit and a hardware interface signal judgment algorithm. The hardware interface signal monitoring processing circuit monitors and samples hardware interface signals (including a system in-position signal, a charge enable signal, a discharge enable signal, an internal discharge enable signal, and an AC_FAIL signal) of a storage system and a BBU in real time, thereby monitoring quality and high/low level values of the hardware interface signals. The hardware interface signal judgment algorithm makes an intelligent judgment according to a sampling condition of the hardware interface signals.

The intelligent power supply switching timing judgment module includes two parts: a sampling processing circuit and an intelligent algorithm. The sampling processing circuit samples an output voltage value of a PSU, and processes and sends the AC_FAIL signal/discharge enable signal to a corresponding interface of the MCU. The intelligent algorithm mainly calculates a time interval between the AC_FAIL signal and the discharge enable signal, performs sampling calculation on a time interval between the AC_FAIL signal and reduction of an output of the PSU to 11.4 V, and performs problem analysis and locating on a working state of the BBU of the storage system according to a sampled value.

The intelligent BBU link I2C timing judgment module includes two parts: an SCL/SDA interface signal sampling processing circuit and an intelligent I2C signal quality analysis algorithm. Therefore, an I2C signal SCL/SDA is sampled to implement intelligent analysis and judgment.

The intelligent BBU control instruction judgment module intelligently analyzes communication data between the storage system and the BBU, thereby monitoring the communication data of the storage system in real time.

The intelligent BBU fault locating module performs fault analysis and locating according to monitoring conditions of the intelligent BBU control signal judgment module, the intelligent BBU link I2C timing judgment module, the intelligent power supply switching timing judgment module, and the intelligent BBU control instruction judgment module, and the working state of the BBU transmitted by the storage system. If accurate locating is needed, fault simulation is performed.

The intelligent BBU fault repair module performs self-repair according to a BBU fault locating condition.

For ease of understanding the present solution based on modes of existence of the above-mentioned function modules, specific descriptions are further made below in combination with two different examples.

Judgment of abnormal charge: the electronic device receives an abnormal BBU charge instruction transmitted by the storage system, and thus enters a charge diagnosis subprogram. There are four possible causes for abnormal charge: abnormal BBU charge input voltage, abnormal charge control logic, abnormal charge software setting, and abnormal charge circuit of the BBU. Therefore, the electronic device reads a historic sampled value of a charge input voltage of the BBU first. If the charge input voltage of the BBU is abnormal, a charge input voltage of the PSU and a charge branch control logic enable signal are read, thereby further determining whether powering of the PSU, a control logic of a charge branch of the BBU, or the charge branch of the BBU is abnormal. If the charge input voltage of the BBU is normal, historic sampled values of a charge enable signal and a system in-position signal are read. Whether a control logic of the storage system or a control link of the storage system is abnormal is determined in combination with a control logic log of the storage system. If the charge input voltage and charge control logic of the BBU are both normal, a historic sampled value of quality of an I2C signal and an analytical value of communication data of the storage system are read, and whether an I2C link or a charge setting condition is abnormal is determined. If determining that software and the control logic are abnormal, the electronic device enters a BBU fault self-repair program. If a hardware circuit is abnormal, a specific fault position and a fault type are prompted on a human-computer interface.

Judgment of abnormal BBU power supply switching test: the electronic device receives a power supply switching test failure instruction transmitted by the storage system, and then enters a discharge diagnosis subprogram. A historic sampled value of the intelligent power supply switching timing judgment module is read. If the time interval between the AC_FAIL signal and the reduction of the output voltage of the PSU to 11.4 V does not meet a design and model selection specification of the storage system, it is determined that the PSU of the storage system is abnormal. If the PSU of the storage system is determined to be normal, the time interval between the AC_FAIL signal and the discharge enable signal of the BBU is read, and whether the control logic of the storage system or the control link of the storage system is abnormal is determined in combination with the control logic log of the storage system. If determining that the control logic is abnormal, the electronic device enters the BBU fault self-repair program. If the hardware circuit is abnormal, a specific fault position and a fault type are prompted on the human-computer interface.

In addition to the charge diagnosis subprogram and discharge diagnosis subprogram described in the above examples, there are also other diagnosis subprograms corresponding to other anomalies. In the present embodiment, the storage system may substantially analyze the working state of the BBU at the data level, so the execution body in the present embodiment may directly be switched to the corresponding diagnosis subprogram based on a preliminary judgment instruction transmitted by the storage system, improving the determination efficiency.

The present application also provides a readable storage medium, storing a computer program that may be executed by a terminal or a processor to implement the steps provided in the above-mentioned embodiment. The storage medium may include various media capable of storing program codes, such as a U disk, a mobile hard disk, a Read-Only Memory (ROM), a Random Access Memory (RAM), a magnetic disk, or an optical disk.

Each embodiment in the specification is described progressively. Descriptions made in each embodiment focus on differences from the other embodiments, and the same or similar parts in each embodiment refer to the other embodiments. The apparatus disclosed in the embodiments corresponds to the method disclosed in the embodiments, and thus is described relatively briefly, and related parts refer to the descriptions about the method.

Professionals may further realize that the units and algorithm steps of each example described in combination with the embodiments disclosed herein may be implemented by electronic hardware, computer software, or a combination thereof. In order to describe the interchangeability of hardware and software clearly, the compositions and steps of each example have been described generally in the foregoing descriptions according to functions. Whether these functions are executed by hardware or software depends on specific applications and design constraints of the technical solutions. Professionals may realize the described functions for each specific application by use of different methods, but such realization shall fall within the scope of the present application.

The principle and implementation of the present application are described herein with specific examples, and the descriptions about the above embodiments are only for helping in understanding the method and core idea of the present application. Those ordinarily skilled in the art may further make a plurality of improvements and embellishments to the present application without departing from the principle of the present application, and these improvements and embellishments shall also fall within the scope of protection of the claims of the present application.

It is also to be noted that relational terms in the specification, such as first and second, are used only to distinguish an entity or operation from another entity or operation and do not necessarily require or imply the existence of any practical relation or sequence between these entities or operations. Moreover, terms "include" and "contain" or any other variation thereof is intended to cover nonexclusive inclusions, whereby a process, method, object, or device including a series of elements not only includes those elements but also includes other elements that are not clearly listed, or further includes elements intrinsic to the process, the method, the object, or the device. With no more restrictions, an element defined by statement "including a/an . . . " does not exclude the existence of the same other elements in a process, method, object, or device including the element.

What is claimed is:

1. A Backup Battery Unit (BBU) fault diagnosis method, comprising:
   determining, according to power supply switching data, whether a power supply is able to be switched to a target BBU normally;
   in response to determining that the power supply is able to be switched to the target BBU normally, determining a working state of the target BBU according to hardware signals of the target BBU; and
   in response to the working state being determined to be an abnormal state according to the hardware signals, determining an anomaly source by fault simulation;
   wherein the step of determining, according to the power supply switching data, whether the power supply is able to be switched to the target BBU normally comprises:
   acquiring an output voltage value of a Power Supply Unit (PSU) at each time point;
   acquiring occurrence time of an AC_FAIL signal and a discharge enable signal;
   calculating a first time interval between the AC_FAIL signal and the discharge enable signal;
   calculating a second time interval between the occurrence time of the AC_FAIL signal and reduction of the output voltage value of the PSU to a preset voltage value; and
   determining, according to the first time interval and the second time interval, whether the power supply is able to be switched to the target BBU normally.

2. The BBU fault diagnosis method according to claim 1, wherein the step of determining the working state of the target BBU according to the hardware signals of the target BBU comprises:
   acquiring a system in-position signal, charge/discharge enable signal, internal discharge enable signal, and the AC_FAIL signal of the target BBU;
   determining quality and high/low level variations of hardware interface signals of the target BBU according to the system in-position signal, the charge/discharge enable signal, the internal discharge enable signal, and the AC_FAIL signal;
   acquiring an SCL/SDA signal on an Inter-Integrated Circuit (I2C) link of the target BBU; and determining the working state of the target BBU according to the quality, the high/low level variations, and the SCL/SDA signal.

3. The BBU fault diagnosis method according to claim 1, wherein in response to the working state being determined to be a normal state according to the hardware signals, the method further comprises:
   acquiring communication data of a storage system and the target BBU; and
   verifying, according to the communication data, whether a program runtime error occurs to the target BBU.

4. The BBU fault diagnosis method according to claim 1, wherein after determining the anomaly source by fault simulation, the method further comprises:
   determining whether the anomaly source is capable of being repaired automatically; and
   in response to the anomaly source being incapable of being repaired automatically, sending a manual repair prompt through a preset path.

5. The BBU fault diagnosis method according to claim 1, wherein the power supply switching data indicates whether a timing of power supply switching is in line with an expectation.

6. An electronic device, comprising:
   a memory, configured to store a computer program; and
   a processor, configured to execute the computer program to implement steps of:
      determining, according to power supply switching data, whether a power supply is able to be switched to a target BBU normally;
      in response to determining that the power supply is able to be switched to the target BBU normally, determining a working state of the target BBU according to hardware signals of the target BBU; and
      in response to the working state being determined to be an abnormal state according to the hardware signals, determining an anomaly source by fault simulation;
      wherein the step of determining, according to the power supply switching data, whether the power supply is able to be switched to the target BBU normally comprises:
         acquiring an output voltage value of a Power Supply Unit (PSU) at each time point;
         acquiring occurrence time of an AC_FAIL signal and a discharge enable signal;
         calculating a first time interval between the AC_FAIL signal and the discharge enable signal;
         calculating a second time interval between the occurrence time of the AC_FAIL signal and reduction of the output voltage value of the PSU to a preset voltage value; and
         determining, according to the first time interval and the second time interval, whether the power supply is able to be switched to the target BBU normally.

7. The electronic device according to claim 6, wherein the processor is further configured to execute the computer program to implement steps of:
   acquiring a system in-position signal, charge/discharge enable signal, internal discharge enable signal, and the AC_FAIL signal of the target BBU;
   determining quality and high/low level variations of hardware interface signals of the target BBU according to the system in-position signal, the charge/discharge enable signal, the internal discharge enable signal, and the AC_FAIL signal;
   acquiring an SCL/SDA signal on an Inter-Integrated Circuit (I2C) link of the target BBU; and
   determining the working state of the target BBU according to the quality, the high/low level variations, and the SCL/SDA signal.

8. The electronic device according to claim 6, wherein the processor is further configured to execute the computer program to implement steps of:
   acquiring communication data of a storage system and the target BBU; and
   verifying, according to the communication data, whether a program runtime error occurs to the target BBU.

9. The electronic device according to claim 6, wherein the processor is further configured to execute the computer program to implement steps of:
   determining whether the anomaly source is capable of being repaired automatically; and
   in response to the anomaly source being incapable of being repaired automatically, sending a manual repair prompt through a preset path.

10. The electronic device according to claim 6, wherein the power supply switching data indicates whether a timing of power supply switching is in line with an expectation.

11. A non-transitory readable storage medium, storing a computer program that is executed by a processor to implement steps of:
   determining, according to power supply switching data, whether a power supply is able to be switched to a target BBU normally;
   in response to determining that the power supply is able to be switched to the target BBU normally, determining a working state of the target BBU according to hardware signals of the target BBU; and
   in response to the working state being determined to be an abnormal state according to the hardware signals, determining an anomaly source by fault simulation;
   wherein the step of determining, according to the power supply switching data, whether the power supply is able to be switched to the target BBU normally comprises:
      acquiring an output voltage value of a Power Supply Unit (PSU) at each time point;
      acquiring occurrence time of an AC_FAIL signal and a discharge enable signal;
      calculating a first time interval between the AC_FAIL signal and the discharge enable signal;
      calculating a second time interval between the occurrence time of the AC_FAIL signal and reduction of the output voltage value of the PSU to a preset voltage value; and
      determining, according to the first time interval and the second time interval, whether the power supply is able to be switched to the target BBU normally.

12. The non-transitory readable storage medium according to claim 11, wherein the computer program is executed by the processor to implement steps of:
   acquiring a system in-position signal, charge/discharge enable signal, internal discharge enable signal, and the AC_FAIL signal of the target BBU;
   determining quality and high/low level variations of hardware interface signals of the target BBU according to the system in-position signal, the charge/discharge enable signal, the internal discharge enable signal, and the AC_FAIL signal;
   acquiring an SCL/SDA signal on an Inter-Integrated Circuit (I2C) link of the target BBU; and determining the working state of the target BBU according to the quality, the high/low level variations, and the SCL/SDA signal.

13. The non-transitory readable storage medium according to claim 11, wherein the computer program is executed by the processor to implement steps of:
   acquiring communication data of a storage system and the target BBU; and
   verifying, according to the communication data, whether a program runtime error occurs to the target BBU.

14. The non-transitory readable storage medium according to claim 11, wherein the computer program is executed by the processor to implement steps of:
   determining whether the anomaly source is capable of being repaired automatically; and
   in response to the anomaly source being incapable of being repaired automatically, sending a manual repair prompt through a preset path.

15. The BBU fault diagnosis method according to claim 1, wherein the discharge enable signal is from the target BBU as a result of the target BBU starting to power a storage system in response to a trigger signal.

16. The electronic device according to claim 6, wherein the discharge enable signal is from the target BBU as a result of the target BBU starting to power a storage system in response to a trigger signal.

17. The non-transitory readable storage medium according to claim 11, wherein the power supply switching data indicates whether a timing of power supply switching is in line with an expectation.

\* \* \* \* \*